(12) United States Patent
Zhang

(10) Patent No.: US 11,716,837 B2
(45) Date of Patent: Aug. 1, 2023

(54) ELECTROMAGNETIC SHIELDING FILM

(71) Applicant: SHINE OPTOELECTRONICS (KUNSHAN) CO., LTD., Kunshan (CN)

(72) Inventor: Sheng Zhang, Kunshan (CN)

(73) Assignee: SHINE OPTOELECTRONICS (KUNSHAN) CO., LTD., Kunshan (CN)

(*) Notice: Subject to any disclaimer, the term of this patent is extended or adjusted under 35 U.S.C. 154(b) by 4 days.

(21) Appl. No.: 17/536,411

(22) Filed: Nov. 29, 2021

(65) Prior Publication Data
US 2022/0087081 A1 Mar. 17, 2022

Related U.S. Application Data

(63) Continuation of application No. PCT/CN2020/080120, filed on Mar. 19, 2020.

(30) Foreign Application Priority Data

Jun. 18, 2019 (CN) .......................... 201910527460.2

(51) Int. Cl.
H05K 9/00 (2006.01)
(52) U.S. Cl.
CPC ............ H05K 9/0088 (2013.01); H05K 9/009 (2013.01)
(58) Field of Classification Search
CPC .............................. H05K 9/0088; H05K 9/009
See application file for complete search history.

(56) References Cited

U.S. PATENT DOCUMENTS

2018/0232080 A1* 8/2018 Iwami .................. H05K 9/0096

FOREIGN PATENT DOCUMENTS

| CN | 106686965 A | 5/2017 |
|---|---|---|
| CN | 107835561 A | 3/2018 |
| CN | 108848660 A | 11/2018 |
| CN | 109769387 A | 5/2019 |
| CN | 210432328 U | 4/2020 |
| JP | 2012164885 A | 8/2012 |
| WO | 2011148979 A1 | 12/2011 |

OTHER PUBLICATIONS

International Search Report issued in corresponding PCT Application No. PCT/CN2020/080120, dated Jun. 18, 2020.
Written Opinion issued in corresponding PCT Application No. PCT/CN2020/080120, dated Jun. 18, 2020.

* cited by examiner

Primary Examiner — Hung V Ngo
(74) Attorney, Agent, or Firm — Westbridge IP LLC

(57) ABSTRACT

Disclosed is an electromagnetic shielding film, including a supporting layer and N conductive layers. The supporting layer has a first side surface and a second side surface arranged oppositely, the N conductive layers are stacked on at least one of the first side surface and the second side surface, and N≥2. Each of the N conductive layers includes a conductive grid, the conductive grid includes a conductive material filled in a grid-shaped trench, and at least two of the N conductive layers have conductive materials for shielding different bands, respectively. Different conductive layers have different conductive materials, and therefore can shield different bands, thereby broadening a shielding band of the electromagnetic shielding film, which can better meeting market demands.

18 Claims, 8 Drawing Sheets

ELECTROMAGNETIC SHIELDING FILM

CROSS-REFERENCE TO RELATED APPLICATIONS

This application is a continuation of International Application No. PCT/CN2020/080120, filed on Mar. 19, 2020, which claims priority to Chinese Patent Application No. 201910527460.2, filed on Jun. 18, 2019. The disclosures of the aforementioned applications are hereby incorporated by reference in their entireties.

TECHNICAL FIELD

The present disclosure relates to electronic technology, and in particular to an electromagnetic shielding film.

BACKGROUND

In recent years, with rapid development of the information-based society, electronic devices associated with information have developed rapidly. A requirement for electromagnetic shielding of such as an aerospace device, an advanced optical instrument, a communication device and a medical diagnostic instrument becomes higher and higher. However, an existing electromagnetic shielding film has a narrow shielding band, and is easy to be penetrated by an interference signal to lose shielding effect with continuous update of an electromagnetic interference technology.

SUMMARY

In view of this, it is necessary to provide an electromagnetic shielding film to solve the foregoing technical problems.

A technical solution of the present disclosure is described as follows:

An electromagnetic shielding film, including:

a supporting layer, having a first side surface and a second side surface arranged oppositely; and N conductive layers, stacked on at least one of the first side surface and the second side surface, where N≥2, each of the N conductive layers includes a conductive grid, the conductive grid includes a conductive material filled in a grid-shaped trench, and at least two of the N conductive layers have conductive materials for shielding different bands, respectively.

In an embodiment, a depth-to-width ratio of the trench is greater than or equal to 2.

In an embodiment, each of the N conductive layers has a different conductive material.

In an embodiment, the conductive grid is a random grid.

In an embodiment, at least one of a grid shape and grid distribution of the conductive grid is randomly set.

In an embodiment, the conductive grid of each conductive layers is a random grid, and random grids of any two conductive layers are different.

In an embodiment, an alignment deviation of conductive grids of any two conductive layers is not less than 20 μm.

In an embodiment, the conductive grid includes a plurality of circular grids and/or elliptical grids.

In an embodiment, the conductive grid includes a plurality of circular grids, and the plurality of circular grids after superposition of the N conductive layers are arranged regularly.

In an embodiment, the plurality of circular grids after superposition of the N conductive layers are arranged in a regular hexagon.

In an embodiment, types or contents of the conductive materials of the at least two of the N conductive layers are different.

In an embodiment, average apertures of the conductive grids of the at least two of the N conductive layers are different.

In an embodiment, a sectional shape of the trench is rectangle, inverted trapezoid, triangle, arc, or semi-arc.

In an embodiment, conductivities and/or magnetic permeability of the conductive grids of the at least two of the N conductive layers are different.

In an embodiment, the trench includes two side walls and a bottom wall connecting the two side walls, and at least one of the side walls is disposed slantingly.

In an embodiment, at least one of the side walls is a slant arc side wall.

In an embodiment, a fusion portion is provided between adjacent conductive layers, and the conductive layers with the fusion portion are formed to be an integration structure.

In an embodiment, the trench is filled with two or more layers of filling materials, and at least one layer of the filling materials is a conductive material.

In an embodiment, a depth of the trench ranges from 1 μm to 20 μm, a width of the trench ranges from 1 μm to 20 μm, and a thickness of the conductive layer ranges from 3 μm to 50 μm.

In an embodiment, an average filling depth of the conductive material in the trench is no more than 4/5 of a depth of the trench.

The present disclosure has the following beneficial effects. Different conductive layers have different conductive materials, and therefore can shield different bands, thereby broadening a shielding band of an electromagnetic shielding film, which can better meeting market demands.

DETAILED DESCRIPTION

Figure 1:
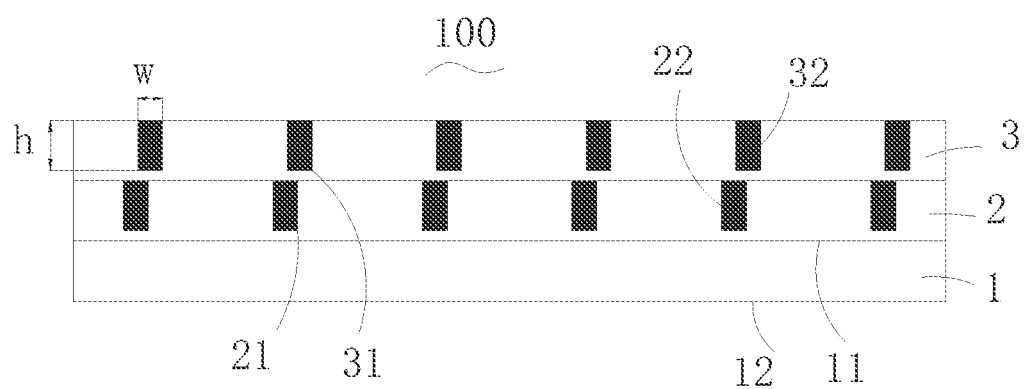
FIG. 1 is a schematic sectional view of an electromagnetic shielding film of the present disclosure.
Figure 2:
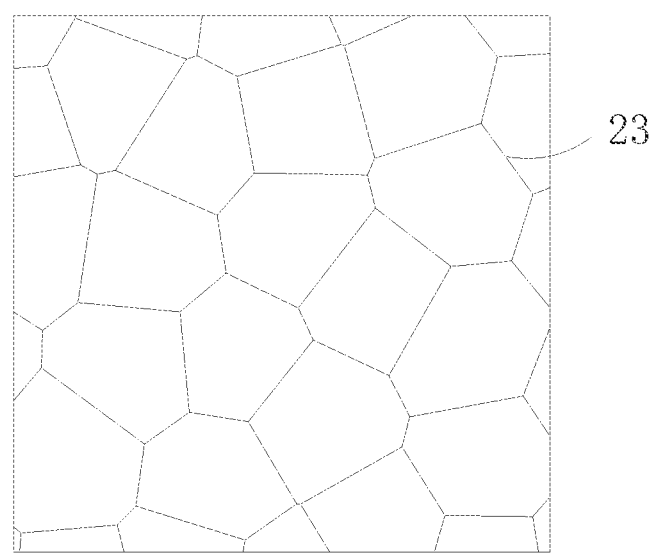
FIG. 2 is a schematic plan view of a first conductive layer of the electromagnetic shielding film shown in FIG. 1.
Figure 3:
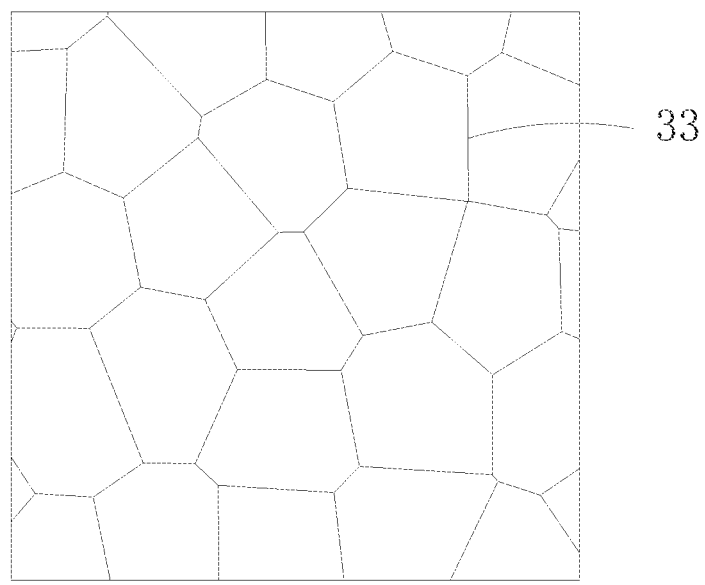
FIG. 3 is a schematic plan view of a second conductive layer of the electromagnetic shielding film shown in FIG. 1.

To easily understand the present disclosure, the present disclosure will be described in more details below with reference to the relevant drawings. Preferred embodiments of the present disclosure are shown in the drawings. However, the present disclosure may be implemented in many different forms, which is not limited to the implementations described below. On the contrary, the purpose of providing these implementations is to make the present disclosure be understood more thoroughly and comprehensively.

It should be noted that when an element is referred to as being "stacked on" another element, the element may be directly on the other element or there may be an intermediate element. When an element is referred to be "connected" to another element, the element may be directly connected to the other element or there may be an intermediate element. Terms "vertical", "horizontal", "left", "right", and similar expressions used herein are for illustrative purpose only, and do not mean that they are the only implementations.

Unless otherwise defined, all technical and scientific terms used herein have the same meaning as commonly understood by those skilled in the art of the present disclosure. The terms used in the specification of the present disclosure are merely for the purpose of describing specific implementations, and are not intended to limit the present disclosure. The term "and/or" used in this specification includes any or all combinations of one or more related listed items.

In the present disclosure, an electromagnetic shielding film is disclosed, including a supporting layer and N conductive layers. The supporting layer may include a first side surface and a second side surface that are arranged oppositely, and the N conductive layers are stacked on the first side surface and/or the second side surface, where N≥2. Each of the N conductive layers may include a conductive grid, the conductive grid may include a grid-shaped trench and a conductive material filled in the trench, and at least two of the N conductive layers have conductive materials for shielding different bands, respectively. Different conductive layers have different conductive materials, different conductive materials have different absorption rates for different bands, and the difference herein means that, a conductive material has a higher absorption rate for one band than another band. Thus, two conductive materials have different ranges of bands for which absorption rates are large, and an effective shielding band of the electromagnetic shielding film may be obtained by superimposing shielding bands of the two conductive materials, thus broadening a shielding band of the electromagnetic shielding film, which can better meeting market demands.

In an embodiment, a depth-to-width ratio of the trench of each conductive layer is greater than or equal to 2, and a large depth-to-width ratio can reduce resistance and increase transmittance.

In an embodiment, each of the N conductive layers has a different conductive material. Since conductive materials are different for each layer, and bands that can be shielded are different, a band of the entire electromagnetic shielding film is wider.

In an embodiment, the conductive grid is a random grid. Specifically, at least one of a grid shape and grid distribution of the conductive grid is randomly set. The conductive grid in each of the N conductive layers is a random grid, and random grids of any two conductive layers are different, so that it is easy to produce, and transmittance of each layer may be guaranteed.

In an embodiment, an alignment deviation of conductive grids of any two of the N conductive layers is not less than 20 μm, for example, the alignment deviation is 30 μm, 50 μm or 70 μm.

In an embodiment, the conductive grid includes a plurality of circular grids and/or elliptical grids. For example, the conductive grid includes a plurality of circular grids, and the plurality of circular grids are arranged according to a regular triangle, a regular quadrilateral, or a regular hexagon. The plurality of circular grids are distributed at each vertex of the regular triangle, the regular quadrilateral, or the regular hexagon. Each vertex may be filled with the circular grids or not. The plurality of circular grids of stacked conductive layers partially overlap, completely overlap, or do not overlap. Preferably, the plurality of circular grids of each conductive layer are distributed at each vertex in a complementary manner. That is, the plurality of circular grids after superposition of the N conductive layers are arranged regularly, for example, the plurality of circular grids after superposition of the N conductive layers are arranged in a regular hexagon. For another example, the conductive grid includes a plurality of elliptical grids, the conductive grid of each conductive layer includes large ellipses and small ellipses arranged alternately at intervals, and the plurality of elliptical grids of stacked conductive layers partially overlap, completely overlap, or do not overlap.

In an embodiment, 3≤N≤20, and a total thickness may be not greater than 180 μm. Within this range, a reasonable shielding band may be obtained, and a thickness of the electromagnetic shielding film may be not too large. Furthermore, the thickness of the N conductive layers may be not greater than 100 μm. If a small-thickness supporting layer, for example, PET or PC, is used together, the thickness of the entire electromagnetic shielding film may be not greater than 180 μm. Certainly, in some application fields, for example, the supporting layer may be a glass layer, and a thickness of the glass layer may be 0.1 mm, 3 mm, or 10 mm, so the thickness of the electromagnetic shielding film may be correspondingly larger.

In an embodiment, the conductive materials filled in each conductive layer may be completely different or partially different. The conductive material may include one or a combination of a metal, a metal oxide, a compound conductive material, or an organic conductive material. The metal may be, for example, Ag, Gu, Al, Zn, Ni, or Fe; the metal oxide may be, for example, $Al_2O_3$; the compound conductive material may be, for example, ITO; and the organic conductive material may be, for example, PEDOT.

In an embodiment, types or contents of the conductive materials of the at least two conductive layers are different. Different types of conductive materials may be used to shield different bands. Conductive materials with the same type but different component contents may also be used to shield different bands.

In an embodiment, average apertures of the conductive grids of the at least two of the N conductive layers are different. For example, random grids, honeycomb grids, circular grids, and the like may have different average apertures, so that a shielding band of each layer may be affected.

In an embodiment, a sectional shape of the trench may be rectangle, inverted trapezoid, triangle, arc or semi-arc, and the sectional shape of each conductive layer may be the same or different. The trench may include two side walls and a bottom wall connecting the two side walls, and at least one of the side walls is disposed slantingly to facilitate demolding after imprinting.

In an embodiment, the supporting layer may be made of glass, organic glass, PET, PC, PMMA or a composite sheet, and the supporting layer may be a transparent substrate.

In an embodiment, each of the N conductive layers is provided with an external conductive portion, and electrical connection can be realized through an external FPC soft board or an additionally overlapping portion. The overlapping portion may be formed by silk screen printing, inkjet printing, sputtering, evaporation, or the like.

In an embodiment, conductivities and/or magnetic permeability of the conductive grids of the at least two conductive layers are different, then absorption rates for a same band are different, and it may also be considered that shielding bands are different.

In an embodiment, a fusion portion is provided between adjacent conductive layers, and the conductive layers with the fusion portion are formed to be an integration structure. For example, two stacked layers are used as an example, a first conductive layer and a second conductive layer are stacked on the first side surface. The first side surface is coated with UV resin, and a grid-shaped trench may be formed after imprinting, curing, and demolding the UV resin. The trench is filled with a first conductive material to form a first conductive grid, so as to form the first conductive layer. A side, away from the first side surface, of the first conductive layer is coated with UV resin, and a grid-shaped trench may be formed after imprinting, curing, and demolding the UV resin. The trench is filled with a second conductive material to form a second conductive grid, so as to form the second conductive layer. The UV resin at an interface part of the first conductive layer and the second conductive layer is fused with each other, the first conductive grid is embedded in the conductive layer, and the first conductive layer and the second conductive layer are formed to be an integration structure. This may facilitate superposition of the conductive layers, and the thickness of the electromagnetic shielding film can also be controlled.

In an embodiment, the trench is filled with two or more layers of filling materials, and at least one layer of the filling materials is a conductive material. For example, the trench is filled with an active polymer and a conductive metal material in sequence.

In an embodiment, a depth of the trench ranges from 1 μm to 20 μm, a width of the trench ranges from 1 μm to 20 μm, and a thickness of the conductive layer ranges from 3 μm to 50 μm. Thicknesses and trench sizes of the conductive layers may be the same or different. For example, a thickness of each conductive layer is 3 μm, a width of the trench is 1 μm, and a depth of the trench is 2 μm.

In an embodiment, the conductive grids of the N conductive layers are set to completely overlap within an error range on a projection surface. Due to an alignment error, it is difficult to implement a complete overlap of the conductive grids of the N conductive layers, so that the complete overlap may be within the error range.

In an embodiment, an average filling depth of the conductive material in the trench may be no more than 4/5 of a trench depth of the trench, that is, the trench is not fully filled with the conductive material.

Hereinafter, for example, electromagnetic shielding films of the present disclosure are described with reference to the drawings.

Figure 4:
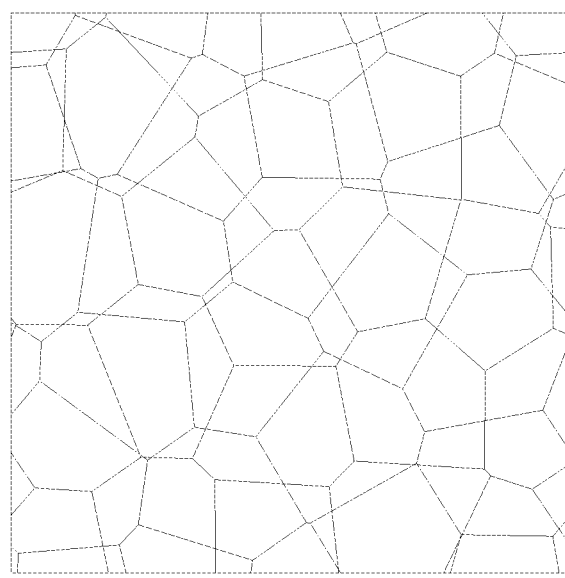
FIG. 4 is a schematic plan view of the electromagnetic shielding film shown in FIG. 1.

Referring to FIG. 1 to FIG. 4, an electromagnetic shielding film 100 includes a supporting layer 1, a first conductive layer 2 and a second conductive layer 3. The supporting layer 1 includes a first side surface 11 and a second side surface 12 that are arranged oppositely, and the first conductive layer 2 and the second conductive layer 3 are stacked on the first side surface 11. The first conductive layer 2 includes a first trench 21 in a grid shape and a first conductive material 22 with which the first trench 21 is filled, so as to form a first conductive grid 23 (please refer to FIG. 2). The second conductive layer 3 includes a second trench 31 in a grid shape and a second conductive material 32 with which the second trench 31 is filled, so as to form a second conductive grid 33 (please refer to FIG. 3). The first conductive grid 23 is a random grid, the second conductive grid 33 is a random grid, and a random grid obtained after superposition of the first conductive grid 23 and the second conductive grid 33 is shown in FIG. 4. For example, the first conductive material 22 is Ag, and the second conductive material is Gu. A shielding band of the first conductive layer 2 is different from that of the second conductive layer 3, and a shielding band of the electromagnetic shielding film 100 may be obtained after superposition of the shielding bands of the first conductive layer 2 and the second conductive layer 3. Therefore, an effective shielding band of the electromagnetic shielding film 100 can be increased, and the electromagnetic shielding film 100 has more market value.

Figure 5:
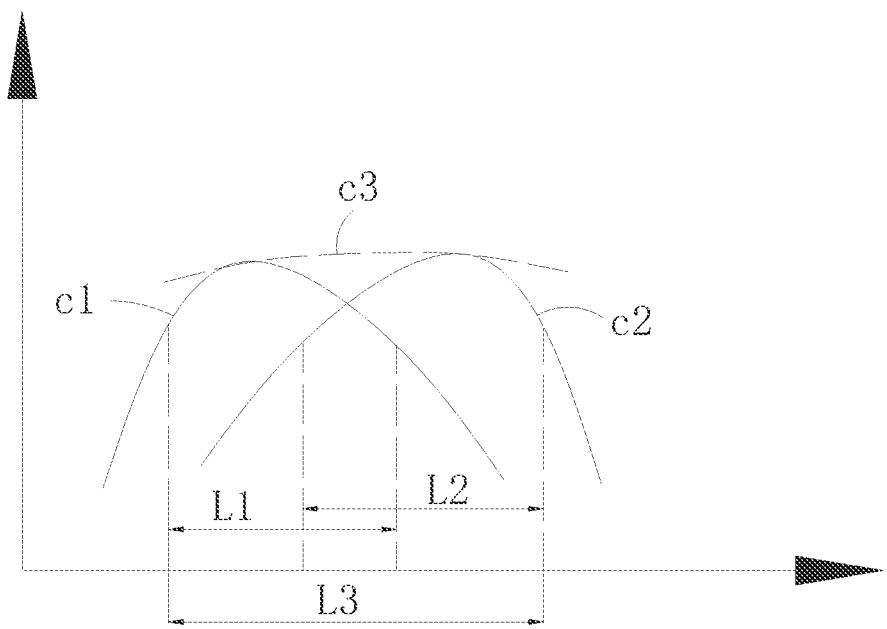
FIG. 5 is a schematic principle diagram of an electromagnetic shielding film of the present disclosure.

For the principle description, please refer to the schematic diagram in FIG. 5. The first conductive layer 2 uses the first conductive material 22 to form the first conductive grid 23, and an absorption rate for a band is shown by the curve c1 in the figure. As an absorption rate in the range of L1 is greater than that in other bands, a shielding band of the first conductive layer 2 can be set to L1. The second conductive layer 3 uses the second conductive material 32 to form the second conductive grid, and an absorption rate for a band is shown by the curve c2 in the figure. As an absorption rate in the range of L2 is greater than that in other bands, a shielding band of the second conductive layer 3 can be set to L2. The curve c3 obtained through superposition can be regarded as an absorption rate for a band of the electromagnetic shielding film 100, and L3 can be regarded as the shielding band of the electromagnetic shielding film 100. Shielding effect of the electromagnetic shielding film 100 may be strengthened by layering of conductive layers and a use of different conductive materials.

Preferably, if a depth of the first trench 21 is h and a width the first trench 21 is w, a depth-to-width ratio of the first trench 21 may be 2. The depth-to-width ratio of the second trench 32 may also be 2. A larger depth-to-width ratio can guarantee conductivity, high transmittance and low resistance.

Preferably, the supporting layer 1 may be made of PET, the PET is coated with UV resin, and the first trench 21 is formed after imprinting, curing and demolding the UV resin. The first trench 21 is filled with the first conductive material 22 to form the first conductive layer 2 with the first conductive grid 23. The first conductive layer 2 is coated with UV resin, and the second trench 31 is formed after imprinting, curing, and demolding the UV resin. The second trench 31 is filled with the second conductive material 32 to form the second conductive layer 3 with the second conductive grid 33. The UV resin at a lamination part of the first conductive layer 2 and the second conductive layer 3 is fused with each other, that is, there may not be a particularly obvious interface between the first conductive layer 2 and the second conductive layer 3, so that the first conductive layer 2 and the second conductive layer 3 are formed as an integration structure, and the first conductive grid 23 is embedded in the UV resin.

Preferably, an average aperture of the first conductive grid 23 is equal to that of the second conductive grid 33.

Figure 6:
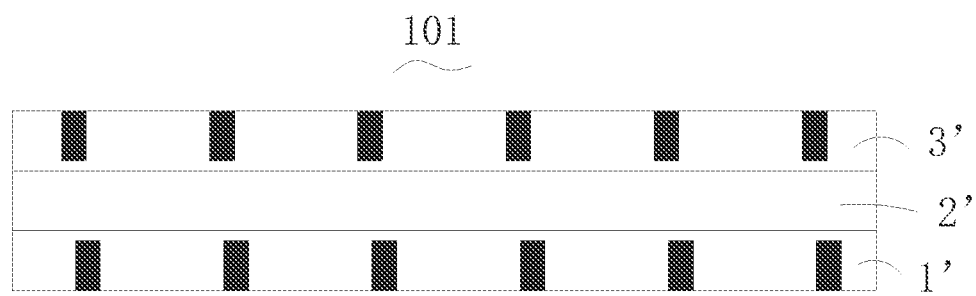
FIG. 6 is another schematic sectional view of an electromagnetic shielding film of the present disclosure.
Figure 7:
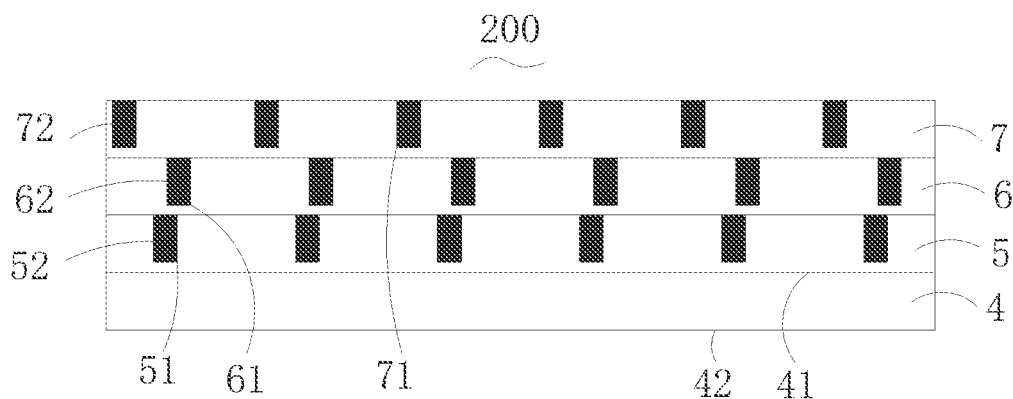
FIG. 7 is another schematic sectional diagram of an electromagnetic shielding film of the present disclosure.
Figure 8:
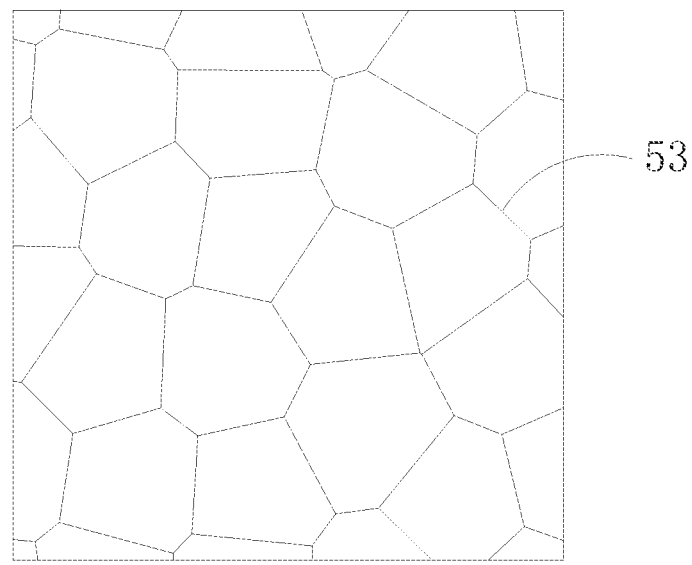
FIG. 8 is a schematic plan view of a first conductive layer of the electromagnetic shielding film shown in FIG. 7.
Figure 9:
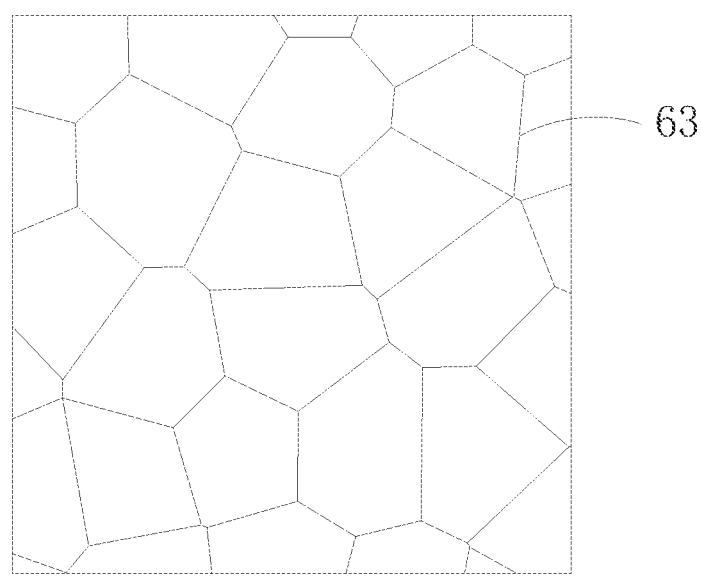
FIG. 9 is a schematic plan view of a second conductive layer of the electromagnetic shielding film shown in FIG. 7.
Figure 10:
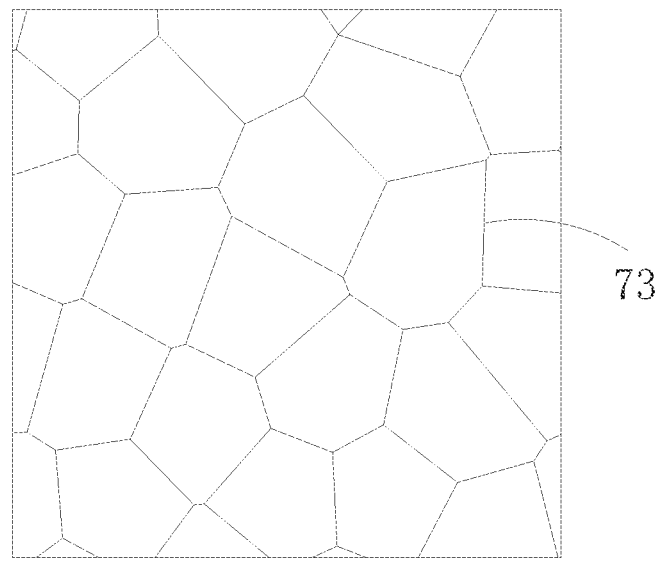
FIG. 10 is a schematic plan view of a third conductive layer of the electromagnetic shielding film shown in FIG. 7.

Referring to FIG. 6, an electromagnetic shielding film 101 includes a supporting layer 2', a first conductive layer 1' and a second conductive layer 3'. The first conductive layer 1' and the second conductive layer 3' are respectively located on two sides of the supporting layer 2'.

Figure 11:
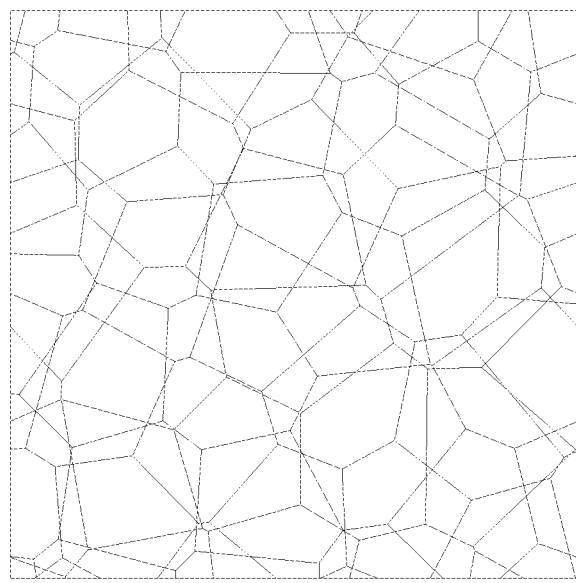
FIG. 11 is a schematic plan view of the electromagnetic shielding film shown in FIG. 7.

Referring to FIG. 7 to FIG. 11, an electromagnetic shielding film 200 includes a supporting layer 4, a first conductive layer 5, a second conductive layer 6, and a third conductive layer 7. The supporting layer 4 includes a first side surface 41 and a second side surface 42 that are arranged oppositely, and the first conductive layer 5, the second conductive layer 6, and the third conductive layer 7 are stacked on the first side surface 41. The first conductive layer 5 includes a first trench 51 in a grid shape and a first conductive material 52 with which the first trench 51 is filled, so as to form a first conductive grid 53 (please refer to FIG. 8). The second conductive layer 6 is stacked on the first conductive layer 5. The second conductive layer 6 includes a second trench 61 in a grid shape and a second conductive material 62 with which the second trench 61 is filled, so as to form a second conductive grid 63 (please refer to FIG. 9). The third conductive layer 7 is stacked on the second conductive layer 6. The third conductive layer 7 includes a third trench 71 in a grid shape and a third conductive material 72 with which the third trench 71 is filled, so as to form a third conductive grid 73 (please refer to FIG. 10). The first conductive grid 53 is a random grid, the second conductive grid 63 is a random grid, the third conductive grid 73 is a random grid, and a random grid obtained after superposition is shown in FIG. 11. The first conductive material 52 is Ag, the second conductive material 62 is Gu, and the third conductive material 72 is Al. The first conductive layer 5, the second conductive layer 6, and the third conductive layer 7 have different shielding bands, so that a shielding band of the electromagnetic shielding film 200 can be increased.

Figure 12:
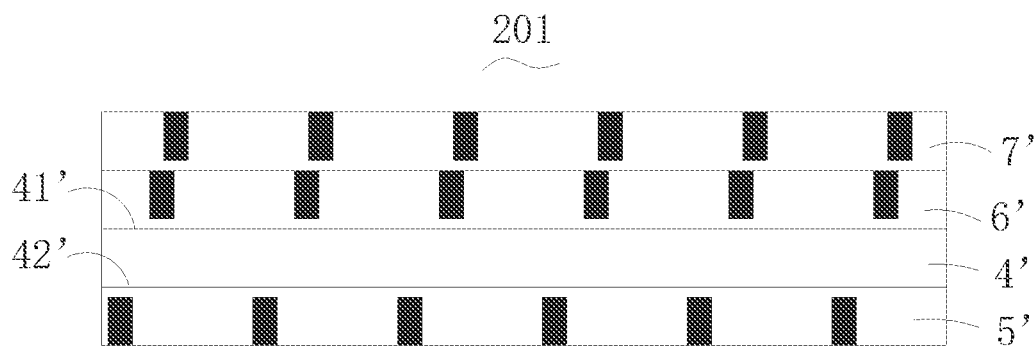
FIG. 12 is another schematic sectional view of an electromagnetic shielding film of the present disclosure.

Referring to FIG. 12, an electromagnetic shielding film 201 includes a supporting layer 4', a first conductive layer 5', a second conductive layer 6', and a third conductive layer 7'. The supporting layer 4' includes a first side surface 41' and a second side surface 42' that are arranged oppositely. The first conductive layer 5' is located on the second side surface 42', the second conductive layer 6' is located on the first side surface 41', and the third conductive layer 7' is stacked on the second conductive layer 6'.

Figure 13:
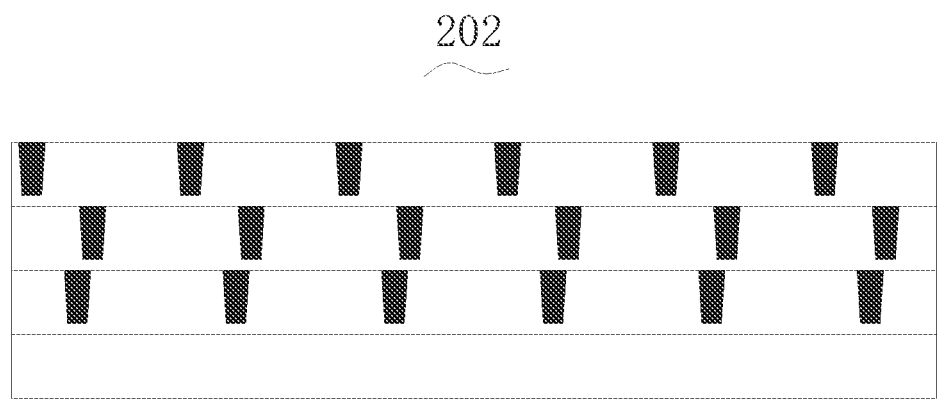
FIG. 13 is another schematic sectional view of an electromagnetic shielding film of the present disclosure.

Referring to FIG. 13, a section shape of a trench of an electromagnetic shielding film 202 is an inverted trapezoid with slant side walls, which facilitates demolding during imprinting and guarantees yield.

Figure 14:
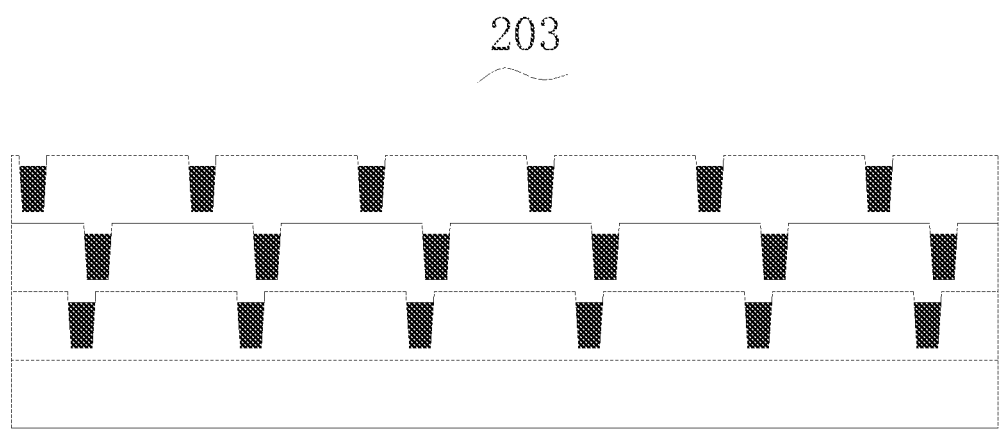
FIG. 14 is another schematic sectional view of an electromagnetic shielding film of the present disclosure.

Referring to FIG. 14, a conductive material filled in a trench of an electromagnetic shielding film 203 does not exceed ⅘ of the trench to guarantee conductivity.

Figure 15:
FIG. 15 is another schematic sectional view of an electromagnetic shielding film of the present disclosure.
Figure 15:
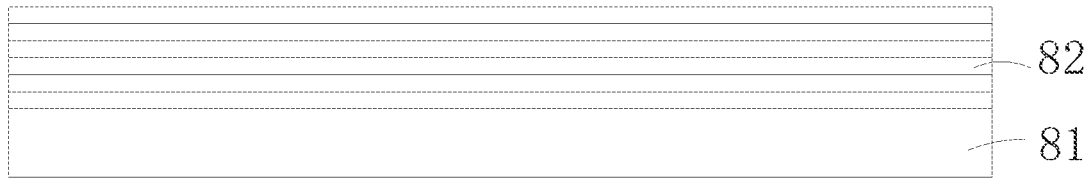

Referring to FIG. 15, an electromagnetic shielding film 301 includes a supporting layer 81 and N conductive layers 82 on the supporting layer 81, in which N=6, and the N conductive layers 82 are located on one side of the supporting layer 81. Preferably, the six conductive layers 82 are filled with different conductive materials.

Figure 16:
FIG. 16 is another schematic sectional view of an electromagnetic shielding film of the present disclosure.
Figure 16:
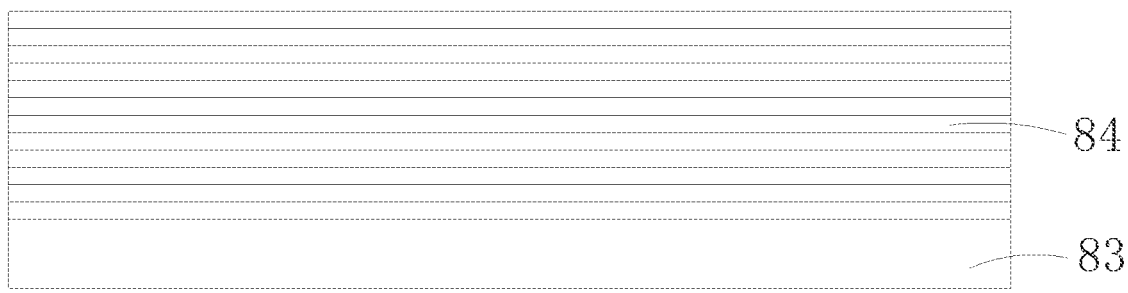

Referring to FIG. 16, an electromagnetic shielding film 302 includes a supporting layer 83 and N conductive layers 84 located on the supporting layer 83, in which N=12, and the N conductive layers 84 are located on one side of the supporting layer 83.

Figure 17:
FIG. 17 is another schematic sectional view of an electromagnetic shielding film of the present disclosure.
Figure 17:
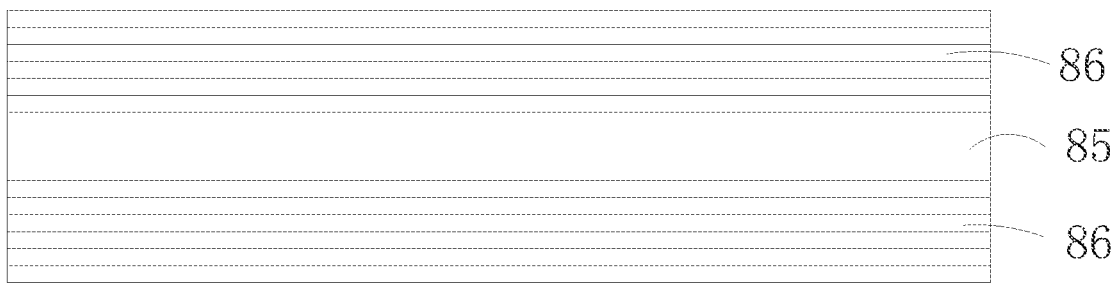

Referring to FIG. 17, an electromagnetic shielding film 303 includes a supporting layer 85 and N conductive layers 86 located on the supporting layer 85, in which N=12, six conductive layers 86 are located on one side of the supporting layer 85, and the other six conductive layers 86 are located on the other side of the supporting layer 85.

Figure 18:
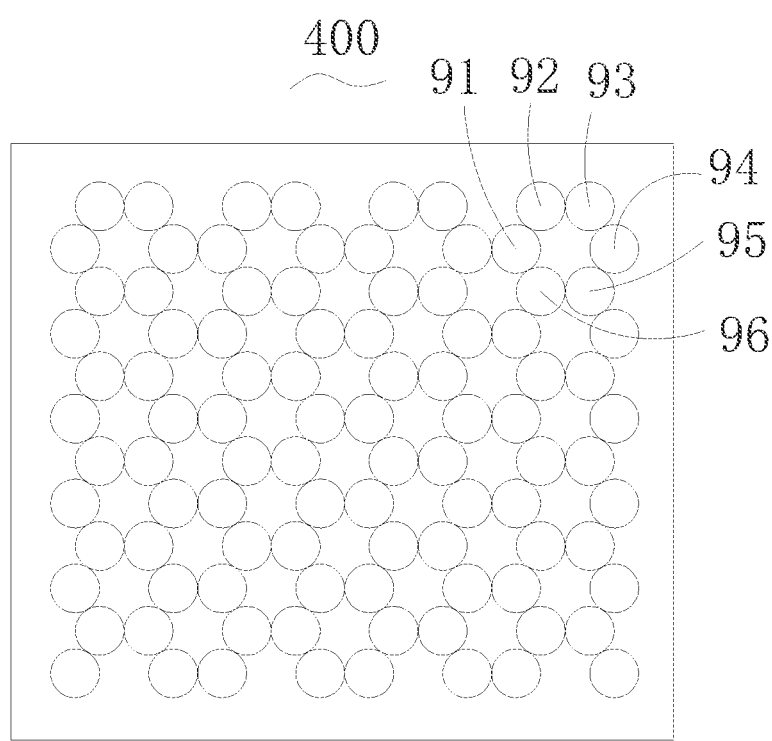
FIG. 18 is another schematic plan view of an electromagnetic shielding film of the present disclosure.

Referring to FIG. 18, an electromagnetic shielding film 400 includes six conductive layers, conductive layer 91, conductive layer 92, conductive layer 93, conductive layer 94, conductive layer 95, and conductive layer 96. A conductive grid of each conductive layer may include a plurality of circular grids, and the plurality of circular grids are distributed at each vertex of a regular hexagon. Each conductive layer has one to six circular grids. A honeycomb conductive grid may be formed on a projection surface after superposition of the six conductive layers.

To make the foregoing objectives, features and advantages of the present disclosure more obvious and comprehensible, the specific implementations of the present disclosure are described in detail above with reference to the drawings. In the foregoing description, many specific details are set forth in order to fully understand the present disclosure. However, the present disclosure can be implemented in many other ways different from those described above, and those skilled in the art can make similar improvements without departing from the essence of the present disclosure. Therefore, the present disclosure is not limited by the specific embodiments disclosed above. Moreover, the technical features of the foregoing embodiments can be combined arbitrarily. To make the description concise, not all possible combinations of the various technical features in the foregoing embodiments are described. However, as long as there is no contradiction in the combination of these technical features, it shall fall into the scope of this specification.

The foregoing embodiments describe only several implementations of the present disclosure, and the description is relatively specific and detailed, but they should not be understood as a limitation to the patent scope of the present disclosure. It should be noted that those skilled in the art may further make several variations and improvements without departing from the concept of the present disclosure, and all these variations and improvements shall fall into the protection scope of the present disclosure. Therefore, the protection scope of the present disclosure shall be subject to the protection scope of the claims.

What is claimed is:

1. An electromagnetic shielding film, comprising:
a supporting layer, having a first side surface and a second side surface arranged oppositely; and
N conductive layers, stacked on at least one of the first side surface and the second side surface, wherein N≥2,
wherein each of the N conductive layers comprises a conductive grid, the conductive grid comprises a conductive material filled in a grid-shaped trench, and at least two of the N conductive layers have conductive materials for shielding different bands, respectively; and wherein an average filling depth of the conductive material in the trench is no more than ⅘ of a depth of the trench.

2. The electromagnetic shielding film according to claim 1, wherein a depth-to-width ratio of the trench is greater than or equal to 2.

3. The electromagnetic shielding film according to claim 1, wherein each of the N conductive layers has a different conductive material.

4. The electromagnetic shielding film according to claim 1, wherein the conductive grid is a random grid.

5. The electromagnetic shielding film according to claim 4, wherein at least one of a grid shape and grid distribution of the conductive grid is randomly set.

6. The electromagnetic shielding film according to claim 4, wherein the conductive grid of each conductive layer is a random grid, and random grids of any two conductive layers are different.

7. The electromagnetic shielding film according to claim 1, wherein an alignment deviation of conductive grids of any two conductive layers is not less than 20 μm.

8. The electromagnetic shielding film according to claim 1, wherein the conductive grid comprises a plurality of circular grids.

9. The electromagnetic shielding film according to claim 8, wherein the conductive grid comprises a plurality of circular grids, and the plurality of circular grids after superposition of the N conductive layers are arranged regularly.

10. The electromagnetic shielding film according to claim 9, wherein the plurality of circular grids after superposition of the N conductive layers are arranged in a regular hexagon.

11. The electromagnetic shielding film according to claim 1, wherein types or contents of the conductive materials of the at least two of the N conductive layers are different.

12. The electromagnetic shielding film according to claim 1, wherein average apertures of the conductive grids of the at least two of the N conductive layers are different.

13. The electromagnetic shielding film according to claim 1, wherein a sectional shape of the trench is rectangle, or inverted trapezoid.

14. The electromagnetic shielding film according to claim 1, wherein conductivities and/or magnetic permeability of the conductive grids of the at least two of the N conductive layers are different.

15. The electromagnetic shielding film according to claim 1, wherein the trench comprises two side walls and a bottom wall connecting the two side walls, and at least one of the side walls is disposed slantingly.

16. The electromagnetic shielding film according to claim 1, wherein a fusion portion is provided between adjacent conductive layers, and the conductive layers with the fusion portion are formed to be an integration structure.

17. The electromagnetic shielding film according to claim 1, wherein the trench is filled with two or more layers of filling materials, and at least one layer of the filling materials is a conductive material.

18. The electromagnetic shielding film according to claim 1, wherein a depth of the trench ranges from 1 μm to 20 μm, a width of the trench ranges from 1 μm to 20 μm, and a thickness of the conductive layer ranges from 3 μm to 50 μm.

* * * * *